(12) United States Patent
Cho et al.

(10) Patent No.: US 12,483,230 B2
(45) Date of Patent: Nov. 25, 2025

(54) APPARATUS AND METHOD FOR MONITORING DUTY CYCLE OF MEMORY CLOCK SIGNAL

(71) Applicant: ELECTRONICS AND TELECOMMUNICATIONS RESEARCH INSTITUTE, Daejeon (KR)

(72) Inventors: Min-Hyung Cho, Daejeon (KR); Yi-Gyeong Kim, Daejeon (KR); Su-Jin Park, Daejeon (KR); Young-Deuk Jeon, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 140 days.

(21) Appl. No.: 18/454,507

(22) Filed: Aug. 23, 2023

(65) Prior Publication Data
US 2024/0195400 A1  Jun. 13, 2024

(30) Foreign Application Priority Data

Dec. 8, 2022  (KR) .......................... 10-2022-0170895
May 22, 2023  (KR) .......................... 10-2023-0065475

(51) Int. Cl.
*H03K 7/08* (2006.01)
*H03K 5/00* (2006.01)
(Continued)

(52) U.S. Cl.
CPC ........... *H03K 7/08* (2013.01); *H03K 5/00006* (2013.01); *H03K 5/05* (2013.01); *H03K 5/131* (2013.01);
(Continued)

(58) Field of Classification Search
CPC ........... H03K 7/08; H03K 5/05; H03K 5/131; H03K 5/15066; H03K 5/1565; H03K 5/00006
(Continued)

(56) References Cited

U.S. PATENT DOCUMENTS

2010/0067635 A1 * 3/2010 Prentice .................. H03K 9/08
                                                    375/376
2014/0097825 A1   4/2014 Hsu
(Continued)

FOREIGN PATENT DOCUMENTS

KR  10-1995-0014894   6/1995
KR  10-2007-0000773   1/2007
(Continued)

OTHER PUBLICATIONS

MC14040B-D-103957.pdf, Aug. 2014—Rev. 11, available at https://www.mouser.com/datasheet/2/308/MC14040B-D-103957.pdf?srsltid=Afm     BOori5cSe0d-Y6RuvuiLzWdoC-a5KCEDEjS-_8_oKLGFaa2SxM8-p This NPL teaches a pulse counter which includes multiple flip-flops. (Year: 2014).*
(Continued)

*Primary Examiner* — Hannah S Wang
(74) *Attorney, Agent, or Firm* — KILE PARK REED & HOUTTEMAN PLLC

(57) ABSTRACT

Disclosed herein are an apparatus and method for monitoring the duty cycle of a memory clock signal. The apparatus for monitoring a duty cycle of a memory clock signal includes a clock frequency converter configured to generate a second monitoring target clock signal by decreasing a frequency of a first monitoring target clock signal while maintaining a duty cycle of the first monitoring target clock signal, and a pulse counter configured to measure a pulse width of the second monitoring target clock signal using a reference clock signal.

6 Claims, 16 Drawing Sheets

(51) Int. Cl.
  *H03K 5/05* (2006.01)
  *H03K 5/131* (2014.01)
  *H03K 5/15* (2006.01)
  *H03K 5/156* (2006.01)
(52) U.S. Cl.
  CPC ....... *H03K 5/15066* (2013.01); *H03K 5/1565* (2013.01)
(58) Field of Classification Search
  USPC ......................................................... 375/238
  See application file for complete search history.

(56) References Cited

U.S. PATENT DOCUMENTS

| 2017/0257087 | A1* | 9/2017 | Elbadry | H02M 3/07 |
| 2020/0160902 | A1 | 5/2020 | Gans | |
| 2022/0028438 | A1 | 1/2022 | Kim | |
| 2022/0148640 | A1 | 5/2022 | Gans | |
| 2022/0383931 | A1 | 12/2022 | Moon et al. | |

FOREIGN PATENT DOCUMENTS

| KR | 10-2009-0039574 | 4/2009 |
| KR | 10-2019-0093102 | 8/2019 |

OTHER PUBLICATIONS

Lee et al., "An 8.5-GB/s/Pin 12-Gb LPDDR5 SDRAM With a Hybrid-Bank Architecture, Low Power, and Speed-Boosting Techniques", IEEE Journal of Solid-State Circuits, Jan. 2021, pp. 212-224, vol. 56, No. 1.

* cited by examiner

APPARATUS AND METHOD FOR MONITORING DUTY CYCLE OF MEMORY CLOCK SIGNAL

CROSS REFERENCE TO RELATED APPLICATIONS

This application claims the benefit of Korean Patent Application Nos. 10-2022-0170895, filed Dec. 8, 2022 and 10-2023-0065475, filed May 22, 2023, which are hereby incorporated by reference in their entireties into this application.

BACKGROUND OF THE INVENTION

1. Technical Field

The following embodiments relate to technology for monitoring the duty cycle of a memory clock signal.

2. Description of the Related Art

The term "duty cycle" refers to the ratio of duration of a logic high signal $T_{PW}$ (PW: pulse width) to one period $T_{CK}$ of a clock signal (i.e., the reciprocal of a clock frequency 1/freq(CK)) in a periodic signal such as the clock signal. The duty cycle may be represented by the following Equation (1):

$$\text{Duty Cycle } (\%) = \{(T_{PW})/(T_{CK})\} \times 100 \quad (1)$$

Typical digital systems are operated in synchronization with a clock signal, and most digital systems are operated in synchronization with the rising edge of the clock signal between the rising edge and the falling edge of the clock signal. Therefore, the operating speeds of the digital systems are determined by the frequency of the clock signal, but the digital systems are operated without being greatly influenced by the pulse width of the clock signal.

However, Dynamic Random Access Memory (DRAM) used as the main memory of a Personal Computer (PC), a server, a mobile phone, or the like performs a Double Data Rate (DDR) operation to improve a data transfer rate. Unlike a Single Data Rate (SDR) scheme at which one data transmission is performed during one period of a clock signal, a DDR scheme is performed such that, based on the clock signal, data transmission/reception is performed once during a high level (signal) interval of the clock signal, and data transmission/reception is performed once more even during a low-level (signal) interval of the clock signal. That is, during one clock period, data transmission/reception is performed twice, whereby a doubled data transfer rate compared to that of the SDR scheme is implemented.

Meanwhile, because an SDR data transmission/reception system is operated based on the rising edge of the clock signal, a data duration remains uniform when each data transmission is performed unless the clock frequency changes. On the other hand, in the case of a DDR data transmission/reception system, data duration is influenced not only by the frequency of a clock signal, but also by the ratio of duration of the high signal interval and duration of the low signal interval of the clock signal, that is, a duty cycle, during data transmission. Ideally, signal durations for transmission of all pieces of data are identical to each other only when a duty cycle of 50% is maintained, with the result that the maximum data transfer rate may be maintained.

Meanwhile, when the duty cycle of the clock signal deviates from 50%, a decrease in data transfer rate may occur due to a shorter interval between the high signal interval and the low signal interval of the clock signal. Therefore, a DRAM-based memory transmission/reception system includes a function of monitoring the duty cycle information of the clock signal and a function of adjusting the duty cycle in order to maintain the duty cycle of the clock signal, which is the most important and becomes a reference for operation, at a value closer to 50%.

SUMMARY OF THE INVENTION

An embodiment is intended to minimize the time that is required as functions of monitoring and adjusting the duty cycle of a clock signal, which becomes a reference for data transmission/reception in a DDR DRAM-based memory interface system, are repeatedly performed, thus maximally securing the actual data transmission time.

In accordance with an aspect, there is provided an apparatus for monitoring a duty cycle of a memory clock signal, including a clock frequency converter configured to generate a second monitoring target clock signal by decreasing a frequency of a first monitoring target clock signal while maintaining a duty cycle of the first monitoring target clock signal, and a pulse counter configured to measure a pulse width of the second monitoring target clock signal using a reference clock signal.

The clock frequency converter may be configured such that one or more half clock generators configured to output a clock signal by decreasing a frequency of an input clock signal to half while maintaining a duty cycle of the input clock signal are connected in cascade.

The first monitoring target clock signal may be used as the reference clock signal.

Each of the half clock generators may include a clock divider configured to decrease the frequency of the input clock signal to half, a pulse width doubler configured to double a pulse width of the input clock signal, and an AND gate configured to perform a logical AND operation on an output signal of the clock divider and an output signal of the pulse width doubler.

The pulse width doubler may include a capacitor and a reset switch connected in parallel between a first node and a ground terminal, a first current source, a positive terminal of which is connected to a power source, a first switch connected between a negative terminal of the first current source and the first node and turned on/off in response to the first monitoring target clock signal, a second current source, a negative terminal of which is grounded, a second switch connected between a positive terminal of the second current source and the first node and turned on/off in response to an inverted signal of the first monitoring target clock signal, and a comparator, a positive terminal of which is connected to the first node and a negative terminal of which is grounded.

The pulse counter may include multiple flip-flops, the second monitoring target clock signal may be input as an enable signal of each of the multiple flip-flops, and the reference clock signal may be input as a clock signal to each of the multiple flip-flops.

In accordance with another aspect, there is provided a method for monitoring a duty cycle of a memory clock signal, including generating a second monitoring target clock signal by decreasing a frequency of a first monitoring target clock signal while maintaining a duty cycle of the first monitoring target clock signal, and measuring a pulse width of the second monitoring target clock signal using a reference clock signal.

Generating the second monitoring target clock signal may include repeating one or more times an operation of decreasing a frequency of a clock signal to half while maintaining a waveform of the clock signal.

The first monitoring target clock signal may be used as the reference clock signal.

Decreasing the frequency of the clock signal to half while maintaining the waveform of the clock signal may include generating a first output signal by decreasing the frequency of the clock signal to half, generating a second output signal by doubling a pulse width of the clock signal, and performing a logical AND operation on the first output signal and the second output signal.

In accordance with a further aspect, there is provided a device for converting a frequency of a duty cycle monitoring target clock signal, wherein the device is configured to generate a second monitoring target clock signal by decreasing a frequency of a first monitoring target clock signal while maintaining a duty cycle of the first monitoring target clock signal, and the device includes one or more half clock generators connected in cascade, each of the half clock generators being configured to output a clock signal by decreasing a frequency of an input clock signal to half while maintaining a duty cycle of the input clock signal.

Each of the half clock generators may include a clock divider configured to decrease the frequency of the input clock signal to half, a pulse width doubler configured to double a pulse width of the input clock signal, and an AND gate configured to perform a logical AND operation on an output signal of the clock divider and an output signal of the pulse width doubler.

The pulse width doubler may include a capacitor and a reset switch connected in parallel between a first node and a ground terminal, a first current source, a positive terminal of which is connected to a power source, a first switch connected between a negative terminal of the first current source and the first node and turned on/off in response to the first monitoring target clock signal, a second current source, a negative terminal of which is grounded, a second switch connected between a positive terminal of the second current source and the first node and turned on/off in response to an inverted signal of the first monitoring target clock signal, and a comparator, a positive terminal of which is connected to the first node and a negative terminal of which is grounded.

BRIEF DESCRIPTION OF THE DRAWINGS

The above and other objects, features and advantages of the present disclosure will be more clearly understood from the following detailed description taken in conjunction with the accompanying drawings, in which.

DESCRIPTION OF THE PREFERRED EMBODIMENTS

Figure 1:
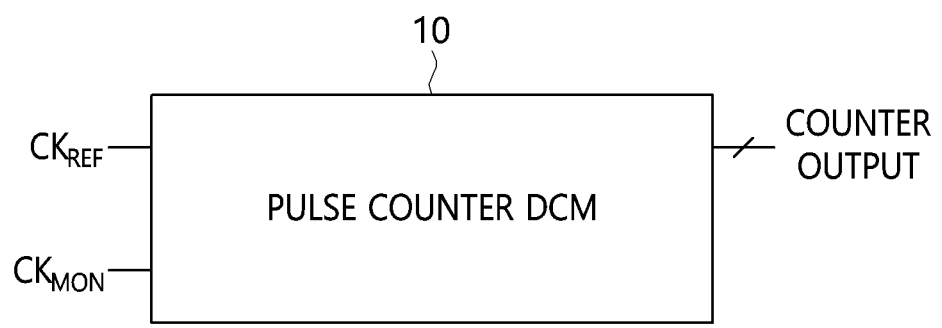
FIG. 1 is a diagram illustrating a typical apparatus for monitoring the duty cycle of a clock signal.

Advantages and features of the present disclosure and methods for achieving the same will be clarified with reference to embodiments described later in detail together with the accompanying drawings. However, the present disclosure is capable of being implemented in various forms, and is not limited to the embodiments described later, and these embodiments are provided so that this disclosure will be thorough and complete and will fully convey the scope of the present disclosure to those skilled in the art. The present disclosure should be defined by the scope of the accompanying claims. The same reference numerals are used to designate the same components throughout the specification.

It will be understood that, although the terms "first" and "second" may be used herein to describe various components, these components are not limited by these terms. These terms are only used to distinguish one component from another component. Therefore, it will be apparent that a first component, which will be described below, may alternatively be a second component without departing from the technical spirit of the present disclosure.

The terms used in the present specification are merely used to describe embodiments, and are not intended to limit the present disclosure. In the present specification, a singular expression includes the plural sense unless a description to the contrary is specifically made in context. It should be understood that the term "comprises" or "comprising" used in the specification implies that a described component or step is not intended to exclude the possibility that one or more other components or steps will be present or added.

Unless differently defined, all terms used in the present specification can be construed as having the same meanings as terms generally understood by those skilled in the art to which the present disclosure pertains. Further, terms defined in generally used dictionaries are not to be interpreted as having ideal or excessively formal meanings unless they are definitely defined in the present specification.

FIG. 1 is a diagram illustrating a typical apparatus for monitoring the duty cycle of a clock signal.

Referring to FIG. 1, a typical duty cycle monitoring apparatus 10 may have a structure of receiving a monitoring target clock signal $CK_{MON}$, the duty cycle of which is to be measured, and a reference clock signal $CK_{REF}$ and generating and outputting n-bit counter output as pulse width information.

Figure 2:
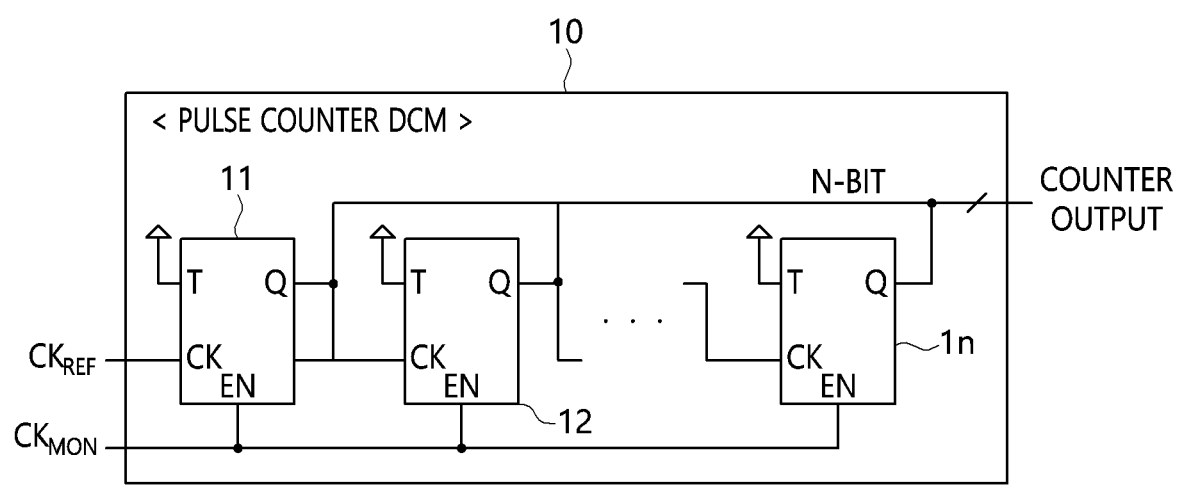
FIG. 2 is a block diagram illustrating the internal configuration of a typical duty cycle monitoring apparatus.
Figure 3:
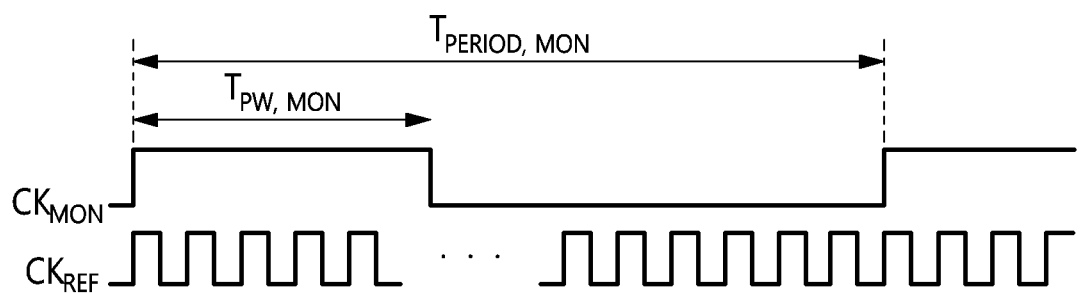
FIG. 3 is a diagram illustrating examples of a clock signal $CK_{MON}$ and a reference clock signal $CK_{REF}$ in a typical duty cycle monitoring apparatus.

FIG. 2 is a block diagram illustrating the internal configuration of a typical duty cycle monitoring apparatus, and FIG. 3 is a diagram illustrating examples of a monitoring target clock signal $CK_{MON}$ and a reference clock signal $CK_{REF}$.

Referring to FIG. 2, the typical duty cycle monitoring apparatus 10 may be composed of multiple flip-flops 11, 12, ..., 1n.

Here, a signal having a clock frequency higher than that of the monitoring target clock signal $CK_{MON}$, the duty cycle of which is to be measured, is used as the reference clock signal $CK_{REF}$.

When the monitoring target clock signal $CK_{MON}$ is used as the enable signal of each of the multiple flip-flops 11, 12, ..., 1n, the flip-flops in the duty cycle monitoring apparatus 10 are enabled and operated in the case where the monitoring target clock signal $CK_{MON}$ is high. As illustrated in FIG. 3, the number of pulses of the reference clock signals $CK_{REF}$ that are input during an interval $T_{PW,MON}$ in which the monitoring target clock signal $CK_{MON}$ is high is counted.

Thereafter, when the monitoring target clock signal $CK_{MON}$ makes a transition to a low state, the operation of the flip-flips in the duty cycle monitoring apparatus 10 is disabled. Here, the counter output of the duty cycle monitoring apparatus 10 indicates information about the pulse width of the monitoring target clock signal $CK_{MON}$.

Also, because the frequencies of the monitoring target clock signal $CK_{MON}$ and the reference clock signal $CK_{REF}$ are known frequencies, the number of reference clock signals $CK_{REF}$ during one period $T_{PERIOD,MON}$ of the monitoring target clock signal $CK_{MON}$ may be calculated from a multiplication of (freq_$CK_{REF}$×freq_$CK_{MON}$). The duty cycle of the monitoring target clock signal $CK_{MON}$ may be calculated from the number of reference clock signals $CK_{REF}$ during one period $T_{PERIOD,MON}$ of the monitoring target clock signal $CK_{MON}$, calculated as described above, and the output value of the duty cycle monitoring apparatus 10.

For example, the duty cycle may be measured as 45% when the monitoring target clock signal $CK_{MON}$ is a signal having a frequency of 1 MHz, the reference clock signal $CK_{REF}$ is a reference signal having a frequency of 100 MHz, and the output value of the duty cycle monitoring apparatus 10 is 45.

However, in the duty cycle monitoring apparatus 10, the reference clock signal $CK_{REF}$ needs to have a frequency higher than that of the monitoring target clock signal $CK_{MON}$. In particular, as the frequency of the reference clock signal $CK_{REF}$ is higher than that of the monitoring target clock signal $CK_{MON}$, the measurement resolution of the duty cycle may be improved, with the result that the duty cycle may be more precisely measured.

As described above, the reference clock signal $CK_{REF}$ having a frequency higher than that of the clock signal $CK_{MON}$, the duty cycle of which is desired to be measured, is required, and, in particular, in order to improve the measurement precision of the duty cycle, a high-speed reference clock $CK_{REF}$ having a frequency that is several times or more higher than that of the monitoring target clock signal is required.

However, DDR DRAM used in a PC, a server, a mobile phone, etc., is already operated at a high-speed clock signal having a frequency of several GHz. For example, DDR5 DRAM corresponding to the latest standard is operated at a clock frequency of a maximum of 3.2 GHz. Therefore, in order to apply the duty cycle monitoring apparatus 10, illustrated in FIG. 2, a high-speed reference clock $CK_{REF}$ having a frequency of several tens of GHz or more is required. However, because it is difficult for the normal memory interface system to implement such a high frequency, the duty cycle monitoring apparatus 10 illustrated in FIG. 2 is not suitable for the measurement of the duty cycle of a clock signal for transmission/reception of memory data.

Figure 4:
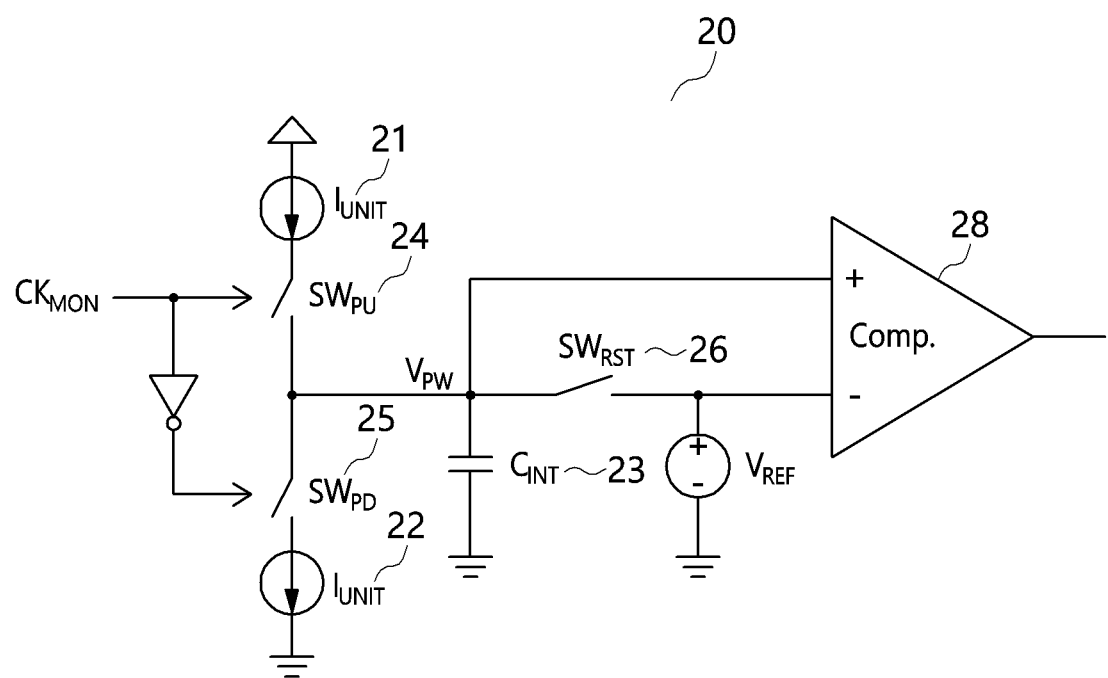
FIG. 4 is a diagram illustrating an example of the configuration of a typical circuit for monitoring the duty cycle of a high-speed memory clock signal.

Therefore, the current normal memory interface system uses an analog-type duty cycle monitoring circuit structure illustrated in FIG. 4, other than the structure illustrated in FIG. 2, is used.

Figure 5:
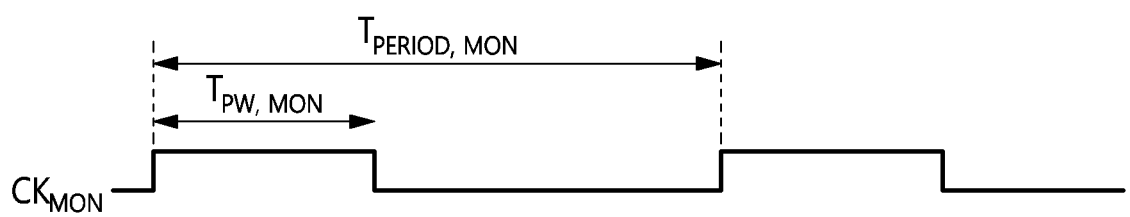
FIG. 5 is a diagram illustrating an example of a duty cycle monitoring target clock signal $CK_{MON}$.
Figure 6:
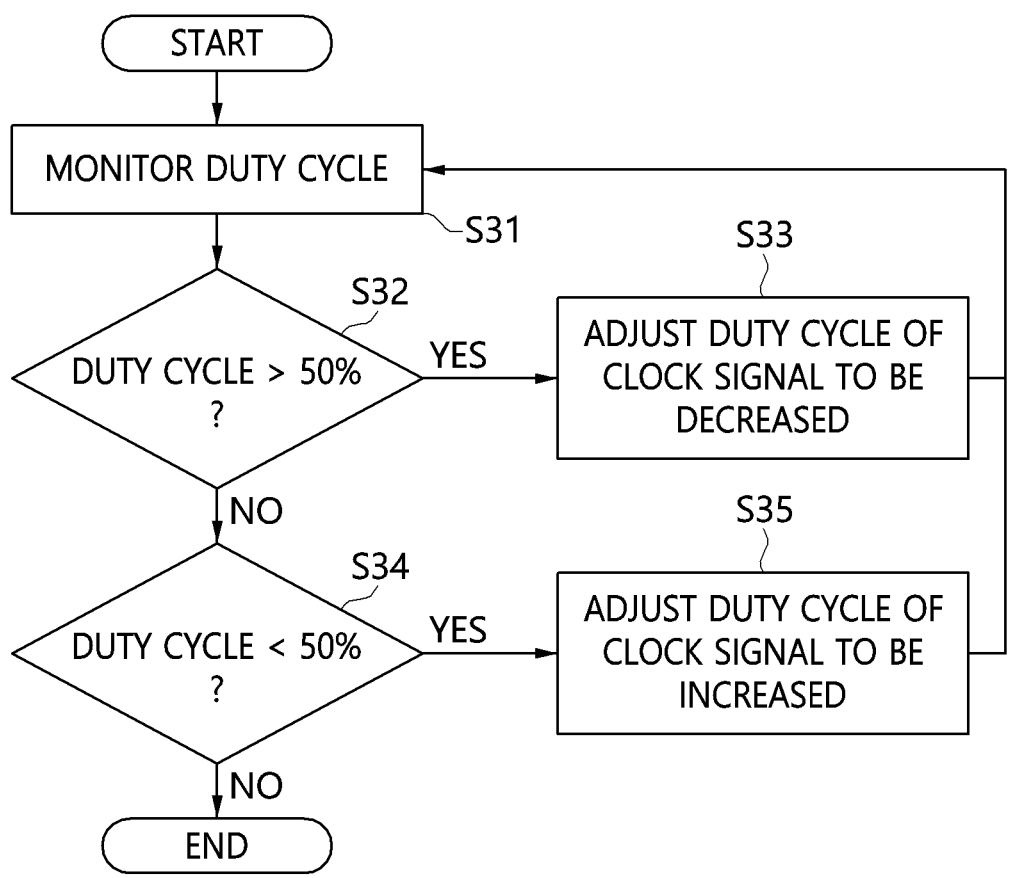
FIG. 6 is a flowchart for explaining a typical process of monitoring and adjusting a duty cycle.

FIG. 4 is a diagram illustrating an example of the configuration of a typical circuit for monitoring the duty cycle of a high-speed memory clock signal, FIG. 5 is a diagram illustrating an example of a duty cycle monitoring target clock signal $CK_{MON}$, and FIG. 6 is a flowchart for explaining a typical duty cycle monitoring and adjustment process.

Referring to FIG. 4, a typical circuit 20 for monitoring the duty cycle of a high-speed signal may include current sources $I_{UNIT}$ 21 and 22, each having an output current of a constant magnitude, a capacitor $C_{INT}$ 23 for accumulatively storing pulse width information through charging and discharging based on the output currents of the current sources $I_{UNIT}$ 21 and 22, switches $SW_{PU}$ 24/$SW_{PD}$ 25 for connecting the output currents of the current sources $I_{UNIT}$ 21 and 22 to the capacitor $C_{INT}$ 23 using a duty cycle monitoring target clock signal $CK_{MON}$ (hereinafter also referred to as a "monitoring target clock signal $CK_{MON}$" or "clock signal $CK_{MON}$") and allowing charging and discharging of the capacitor $C_{INT}$ 23, a reset switch $SW_{RST}$ 26 for initializing the capacitor $C_{INT}$ 23, a reference voltage ($V_{REF}$) source used as the source of the reference voltage of a comparator Comp 28, and the comparator Comp 28 for finally determining duty cycle information stored in the capacitor $C_{INT}$ 23.

Initially, the voltage of the capacitor $C_{INT}$ 23 is initialized to the reference voltage $V_{REF}$ using the reset switch $SW_{RST}$ 26.

Thereafter, as illustrated in FIG. 5, when the duty cycle monitoring target clock signal $CK_{MON}$ is high, the switch $SW_{PU}$ 24 is turned on and the switch $SW_{PD}$ 25 is turned off, whereby charges are stored in the capacitor $C_{INT}$ 23 using the current of the current source $I_{UNIT}$ 21.

Thereafter, when the clock signal $CK_{MON}$ goes low, the switch $SW_{PU}$ 24 is turned off and the $SW_{PD}$ 25 is turned on, and thus charges are discharged from the capacitor $C_{INT}$ 23 using the current of the current source $I_{UNIT}$ 25.

Here, the time during which the switch $SW_{PU}$ 24 is turned on to charge the capacitor $C_{INT}$ 23 is $T_{PW,MON}$ corresponding to the pulse width of the duty cycle monitoring target clock signal $CK_{MON}$, and the time during which the $SW_{PD}$ 25 is turned on to discharge the capacitor $C_{INT}$ 23 may be $T_{PERIOD,MON}-T_{PW,MON}$. Further, during one period of the clock signal $CK_{MON}$, variation in the voltage of the capacitor $C_{INT}$ 23 may be calculated using the following Equation (2):

$$\Delta V_{CINT} = [\{I_{UNIT} \times T_{PW,MON}\} - \{I_{UNIT} \times (T_{PERIOD,MON} - T_{PW,MON})\}]C_{INT} \quad (2)$$

However, when the duty cycle of the clock signal $CK_{MON}$ exceeds 50%, that is, when $(T_{PW,MON})>(T_{PERIOD,MON}-T_{PW,MON})$, $\Delta V_{CINT}$ has a value greater than 0, and thus a voltage value depending on the charges stored in the capacitor $C_{INT}$ 23 is greater than $V_{REF}$.

In contrast, when the duty cycle is less than 50%, that is, when $(T_{PW,MON})<(T_{PERIOD,MON}-T_{PW,MON})$, $\Delta V_{CINT}$ has a value less than 0, and thus the voltage value depending on the charges stored in the capacitor $C_{INT}$ 23 becomes less than the reference voltage $V_{REF}$.

In order to minimize the influence of various types of noise, pulse width information may be accumulated during several periods other than one period of the clock signal $CK_{MON}$, and the pulse width information is then stored in the capacitor $C_{INT}$ 23, after which the reference voltage $V_{REF}$ is compared with the voltage $V_{CINT}$ formed in the capacitor $C_{INT}$ 23. Here, when the voltage $V_{CINT}$ is greater than the reference voltage $V_{REF}$, the duty cycle may be determined to be 50% or more, whereas when the voltage $V_{CINT}$ is less than the reference voltage $V_{REF}$, the duty cycle is determined to be less than 50%.

That is, the above-described analog-type duty cycle monitoring circuit illustrated in FIG. 4 may determine only whether the duty cycle is less than or greater than 50% rather than measuring a precise duty cycle.

Therefore, as illustrated in FIG. 6, in a memory system using the analog-type duty cycle monitoring circuit, a duty cycle is monitored at step S31. Thereafter, when the duty cycle is greater than 50% at step S32, the duty cycle of the clock signal $CK_{MON}$ is adjusted to be decreased at step S33. On the other hand, when the duty cycle is less than 50% at step S34, the duty cycle of the clock signal $CK_{MON}$ is adjusted to be increased at step S35. Thereafter, the duty cycle monitoring at step S31 is re-performed. A procedure including steps S31 to S35 is repeatedly performed until the duty cycle maximally approaches 50%. Therefore, the time attributable to the repetition of monitoring and adjustment of the duty cycle is lengthened.

Further, the memory system needs to perform monitoring and adjustment of a duty cycle whenever an operating environment such as temperature and voltage is changed as well as during a memory initialization process for data transmission. During a period in which such monitoring and adjustment are performed, data transmission is interrupted, and thus data transfer efficiency per unit time is deteriorated.

Of course, in FIG. 4, when an analog-to-digital converter (ADC) instead of the comparator is used, it is possible to check a digitized duty cycle value, as illustrated in FIG. 2, rather than simply determining only whether the duty cycle value is equal to or greater than 50% or less than 50%, thus rapidly completing the adjustment of the duty cycle. However, in the case of the ADC implemented as a typical analog circuit, it is actually difficult to add the circuit as the duty cycle monitoring circuit of the memory system because a chip area required for implementation is large and power consumption is high.

Therefore, when the duty cycle of the clock signal that is used as the most significant reference and is the most important in the DDR DRAM-based memory interface system is monitored, there is a need to measure a precisely digitized value at one time. That is, there is required a method for minimizing the time required for monitoring and adjusting the duty cycle and maximally securing the actual data transmission time by directly measuring and determining the duty cycle rather than determining only whether the duty cycle is greater than or less than 50%.

Figure 7:
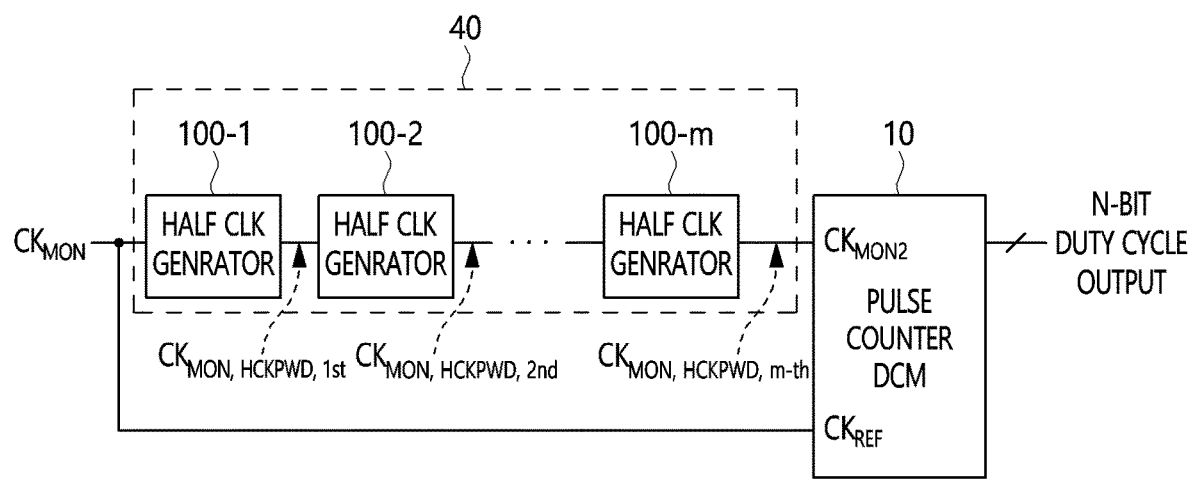
FIG. 7 is a schematic block configuration diagram of an apparatus for monitoring the duty cycle of a memory clock signal according to an embodiment.

FIG. 7 is a schematic block configuration diagram of an apparatus for monitoring the duty cycle of a memory clock signal according to an embodiment.

Referring to FIG. 7, the apparatus for monitoring the duty cycle of a memory clock signal according to the embodiment may include a pulse counter 10 and a clock frequency converter 40.

The clock frequency converter 40 may generate a second monitoring target clock signal $CK_{MON2}$ by decreasing the frequency of a first monitoring target clock signal $CK_{MON}$ while maintaining the duty cycle of the first monitoring target clock signal $CK_{MON}$.

Here, the clock frequency converter 40 may be configured to have a structure in which one or more half clock generators 100-1, 100-2, . . . , 100-m, each configured to output a clock signal by decreasing the frequency of an input clock signal to half while maintaining the duty cycle of the input clock signal, are connected in cascade. Therefore, the second monitoring target clock signal $CK_{MON2}$ may maintain the same duty cycle as the first monitoring target clock signal $CK_{MON}$ to enable duty cycle monitoring, but the frequency thereof is decreased to $(½)^m$.

Meanwhile, the pulse counter 10 may measure the pulse width of the second monitoring target clock signal $CK_{MON2}$ using a reference clock signal $CK_{REF}$.

In this case, the pulse counter 10 has the above-described internal configuration such as that illustrated in FIG. 2. Therefore, the apparatus for monitoring the duty cycle of a memory clock signal according to an embodiment may measure precisely digitized information of the duty cycle of a monitoring target clock signal rather than determining whether the duty cycle of the monitoring target clock signal is equal to or greater than 50%.

Here, the first monitoring target clock signal $CK_{MON}$ may be used as the reference clock signal $CK_{REF}$. Therefore, digitized pulse width information of the second monitoring target clock signal $CK_{MON2}$ input to the pulse counter 10 may be measured by using the first monitoring target clock signal $CK_{MON}$, which is $2^m$ times faster than the second monitoring target clock signal $CK_{MON2}$, as the reference clock.

Then, the detailed configuration of each of the half clock generators 100-1, 100-2, . . . , 100-m will be described below with reference to FIGS. 8 to 12.

Figure 8:
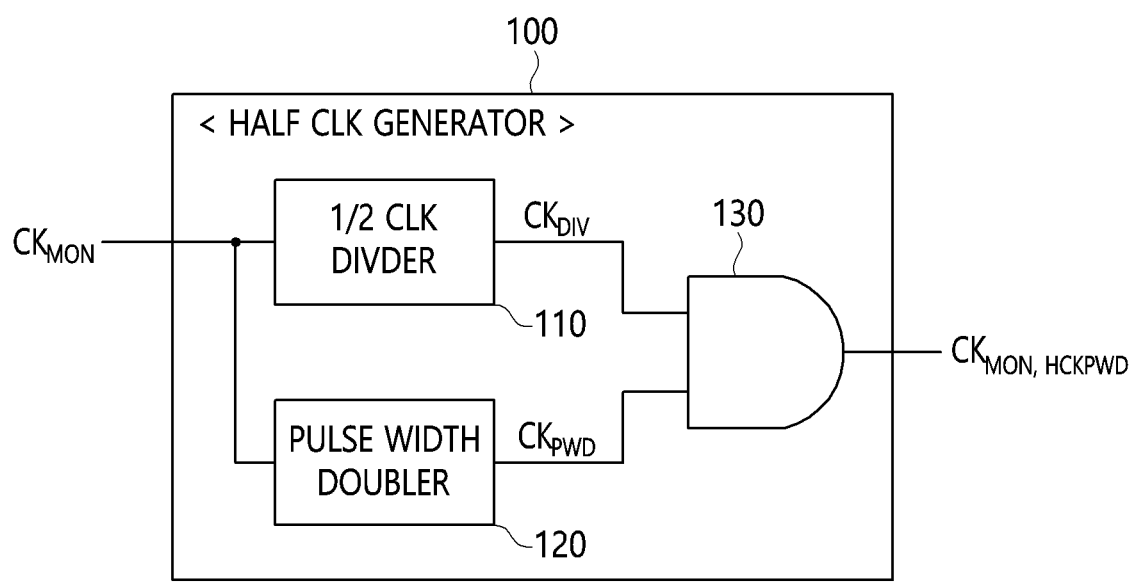
FIG. 8 is a block diagram illustrating the internal configuration of a half clock generator according to an embodiment.
Figure 9:
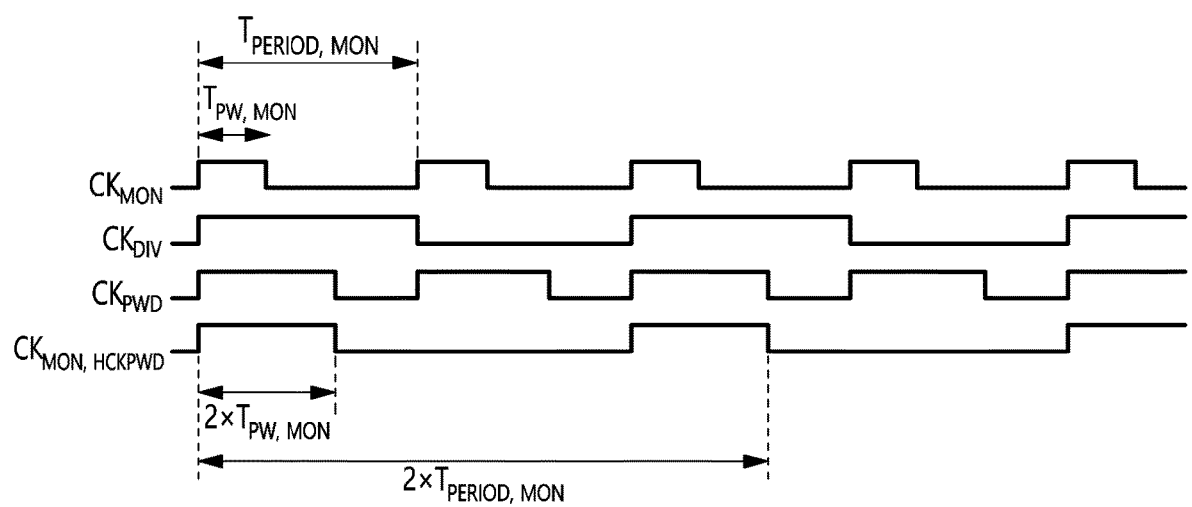
FIG. 9 is a diagram illustrating examples of the output signals of the half clock generator according to an embodiment.

FIG. 8 is a block diagram illustrating the internal configuration of a half clock generator, and FIG. 9 is a diagram illustrating examples of the output signals of the half clock generator.

Referring to FIG. 8, a half clock generator 100 according to an embodiment may include a clock divider 110, a pulse width doubler 120, and an AND gate 130.

The clock divider 110 decreases the frequency of an input clock signal to half. The reason for this is to allow the pulse counter 10 to be used by decreasing the frequency of the input clock signal below a reference clock signal.

Here, the clock divider 110 may be implemented as a typical D flip-flop, a T flip-flop, or the like.

Referring to FIG. 9, when a clock signal $CK_{MON}$, the duty cycle of which deviates from 50%, passes through the clock divider 110, an output signal $CK_DIV$, obtained by decreasing the frequency of the clock signal $CK_{MON}$ to ½, is generated. However, although the frequency of the output signal $CK_DIV$ is decreased to ½ of that of the clock signal $CK_{MON}$, the duty cycle information of the clock signal $CK_{MON}$ is lost. When the duty cycle information is lost in this way, it is impossible to measure the duty cycle of the clock signal $CK_{MON}$.

Therefore, in an embodiment, the pulse width doubler 120 and the AND gate 130 are used to change the duty cycle of a high-speed clock signal to that of a low frequency by maintaining the duty cycle information while decreasing the frequency of the clock signal.

The pulse width doubler 120 may double the pulse width of the input clock signal.

For example, referring to FIG. 9, the pulse width doubler 120 generates and outputs a clock signal $CK_{PWD}$ having a pulse width twice the pulse width $T_{PW,MON}$ of the clock signal $CK_{MON}$ based on the rising edge of the clock signal $CK_{MON}$.

The AND gate 130 performs a logical AND operation on the output signal of the clock divider 110 and the output signal of the pulse width doubler 120.

For example, referring to FIG. 8, the AND gate 130 outputs a clock signal $CK_{MON,HCKPWD}$ obtained by performing a logical AND operation on the output signal $CK_DIV$ and the output signal $CK_{PWD}$.

That is, since the final waveform of the half clock generator 100, that is, the signal $CK_{MON,HCKPWD}$, has a halved clock frequency and then has a doubled period and a doubled pulse width, compared to the input clock signal $CK_{MON}$, the signal $CK_{MON,HCKPWD}$ obtains the same duty ratio as the clock signal $CK_{MON}$.

Meanwhile, referring back to FIG. 7, the clock frequency converter 40 has a configuration in which one or more half clock generators 100, described above with reference to FIGS. 8 and 9, are connected in cascade.

Figure 10:
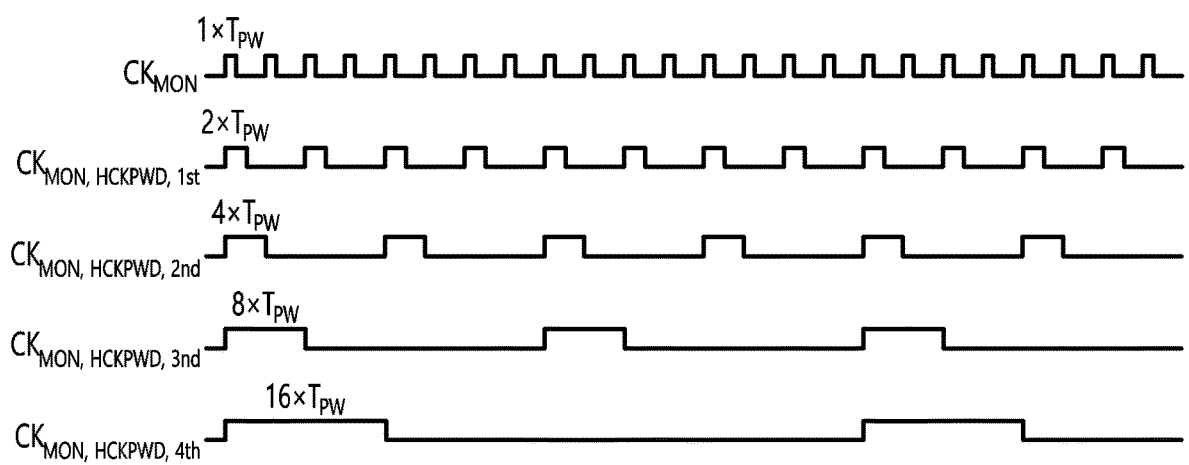
FIG. 10 is a diagram illustrating examples of the output signals of a clock frequency converter according to an embodiment.

For example, referring to FIGS. 7 and 10, the first half clock generator 100-1 outputs a clock signal $CK_{MON,HCKPWD,1st}$ which has a frequency decreased to ½ of that of the actual duty cycle monitoring target clock signal $CK_{MON}$, but maintains the duty cycle thereof. The second half clock generator 100-2 receives the clock signal $CK_{MON,HCKPWD,1st}$ and then outputs a clock signal $CK_{MON,HCKPWD,2nd}$ which has a frequency decreased to ¼ of that of the monitoring target clock signal $CK_{MON}$, but maintains the duty cycle thereof. The third half clock generator 100-3 receives the clock signal $CK_{MON,HCKPWD,2nd}$ and then outputs a clock signal $CK_{MON,HCKPWD,3rd}$ which has a frequency decreased to ⅛ of that of the monitoring target clock signal $CK_{MON}$, but maintains the duty cycle thereof. The fourth half clock generator 100-4 receives the clock signal $CK_{MON,HCKPWD,3rd}$ and then outputs a clock signal $CK_{MON,HCKPWD,4th}$ which has a frequency decreased to ¹⁄₁₆ of that of the monitoring target clock signal $CK_{MON}$, but maintains the duty cycle thereof.

That is, as illustrated in FIG. 7, when the half clock generators 100-1, 100-2, . . . , 100-$m$ are connected in cascade using an m-stage cascading structure, the output signal of the final stage, that is, the second monitoring target clock signal $CK_{MON2}$, may have a frequency that is $(½)^m$ of that of the first monitoring target clock signal $CK_{MON}$ and have the same duty cycle as the first monitoring target clock signal $CK_{MO}N$.

As described above, by utilizing the m-stage half clock generators 100-1, 100-2, . . . , 100-$m$ which are connected in cascade, a signal having the same duty cycle as the first monitoring target clock signal $CK_{MON}$, the frequency range of which is decreased to a desired frequency range, may be generated, and thus the duty cycle digitized as an accurate n-bit digital value may be checked from the output value of the digital circuit-based duty cycle monitoring apparatus.

For example, in FIG. 7, assuming that the input clock signal $CK_{MON}$ is a signal having a frequency of 1.024 GHz and a duty ratio of 25%, and the clock frequency converter 40 has a structure in which 4-stage half clock generators are connected in cascade, the output signal of a fourth half clock generator represents a waveform having a frequency of 64 MHz (1.024 GHz/2⁴) and having a pulse width maintained at 25%. Furthermore, when the pulse counter 10 counts the pulse width of this signal by utilizing the input clock signal $CK_{MON}$ as a reference clock, an output value of '4' may be obtained.

It is known that the final output signal $CK_{MON,HCKPWD, 4th}$ of the 4-stage half clock generators has a frequency that is ¹⁄₁₆ of that of the input clock signal $CK_{MON}$, and it is already known that 16 clock signals $CK_{MON}$ are present in one period of the final output signal $CK_{MON,HCKPWD, 4th}$ depending on the structure and operating conditions. Therefore, when the output value of the pulse counter 10 is divided by $2^m$, for example, when 4 is divided by 16, the duty cycle of the duty cycle monitoring target clock signal $CK_{MON}$ may be measured.

Also, the minimum resolution that can be measured by the apparatus for monitoring the duty cycle of a memory clock signal illustrated in FIG. 7 may be determined by the number of half clock generators 100-1, 100-2, . . . , 100-$m$.

For example, when the 4-stage half clock generators are used, 16 periods of the input clock signal $CK_{MON}$ are input during one period of the final output signal $CK_{MON,HCKPWD, 4th}$ of the fourth stage half clock generator, and thus the minimum duty cycle that can be measured may be 6.25% (¹⁄₁₆).

When, for example, 7-stage half clock generators are used, the minimum duty cycle that can be measured is determined to be about 0.8% (¹⁄₁₂₈).

That is, depending on the minimum resolution of the duty cycle desired to be measured, the number of stages m of the half clock generators 100-1, 100-2, . . . , 100-$m$ illustrated in FIG. 7 needs to be determined.

Figure 11:
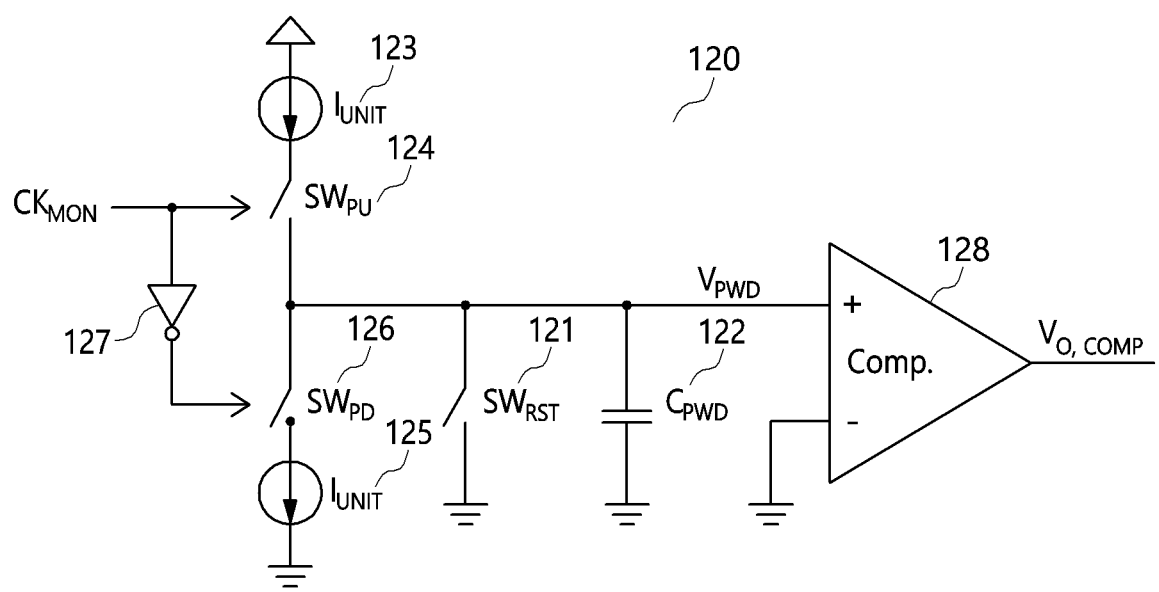
FIG. 11 is a circuit diagram illustrating the internal configuration of a duty cycle doubler according to an embodiment.
Figure 12:
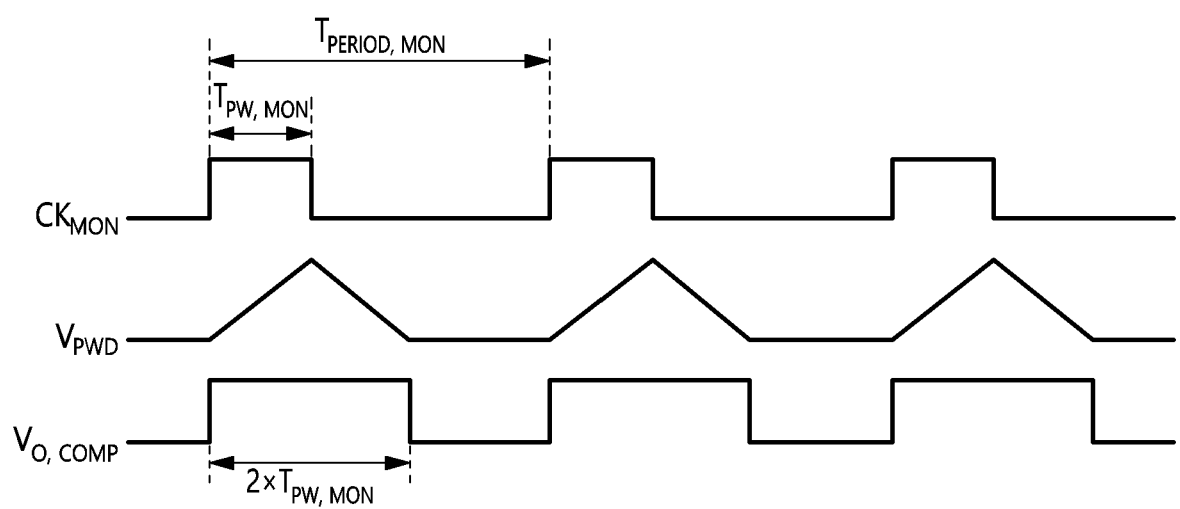
FIG. 12 is a diagram illustrating examples of the operation waveforms of the duty cycle doubler according to an embodiment.

FIG. 11 is a circuit diagram illustrating the internal configuration of a duty cycle doubler according to an embodiment, and FIG. 12 is a diagram illustrating examples of the operation waveforms of the duty cycle doubler according to an embodiment.

Referring to FIG. 11, the duty cycle doubler 120 may include a reset switch SWRST 121 and a capacitor CPWD 122 which are connected in parallel between a first node and a ground terminal, a first current source IUNIT 123, the positive terminal of which is connected to a power source, a first switch SWPU 124 connected between the negative terminal of the first current source IUNIT 123 and the first node and turned on/off in response to a monitoring target clock signal, a second current source IUNIT 125, the negative terminal of which is grounded, a second switch SWPD 126 connected between the positive terminal of the second current source 125 and the first node and turned on/off in response to the inverted signal 127 of the monitoring target clock signal, and a comparator Comp 128, the positive terminal of which is connected to the first node and the negative terminal of which is grounded.

The operation of the duty cycle doubler 120 will be described below.

First, before operation, the capacitor $C_{PWD}$ 122 is reset by turning on the switch $SW_{RST}$ 121.

Next, when an input clock signal $CK_{MON}$ such as that illustrated in FIG. 11 is applied, the first switch $SW_Pu$ 124 is turned on and the capacitor $C_{PWD}$ 122 is charged with current flowing through the current source $I_{UNIT}$ 123 during a period $T_{PW,MOM}$ in which the clock signal $CK_{MON}$ is high.

In this case, when the current flowing through the current source $_{UNIT}$ 123 is constant, the voltage $V_{PWD}$ formed in the capacitor $C_{PWD}$ 122 linearly increases, as illustrated in FIG. 11. Then, the comparator 128 outputs a high signal.

Thereafter, when the clock signal $CK_{MON}$ goes low, the first switch $SW_{PU}$ 124 is turned off, and the second switch $SW_{PD}$ 126 to which the inverted signal 127 of the clock signal $CK_{MON}$ is input is turned on, whereby charges stored in the capacitor $C_{PWD}$ 122 are discharged by the current flowing through the current source $I_{UNIT}$ 125.

Here, as illustrated in FIG. 12, when the voltage $V_{PWD}$ linearly decreases and the voltage $V_{PWD}$ decreases below 0 V, the output of the comparator 128 goes low.

That is, in the case of the pulse width of the signal $CK_{MON}$, during the time $T_{PW,MOM}$, the first switch $SW_{PU}$ 124 is turned on to charge the capacitor $C_{PWD}$ 122 with the current flowing through the current source $I_{UNIT}$ 123, and thus the voltage $V_{PWD}$ linearly increases, whereby the output voltage of the comparator is maintained at high. After the clock signal $CK_{MON}$ makes a transition to a low state, the capacitor $C_{PWD}$ 122 is discharged with the current $I_{UNIT}$ having the same magnitude, and thus the voltage $V_{PWD}$ linearly decreases. The time required by the capacitor $C_{PWD}$ 122 to be discharged to 0 V may be equal to the pulse width $T_{PW,MOM}$ of the clock signal $CK_{MON}$.

Therefore, the output signal of the comparator 128 is maintained at high during the time that is twice the pulse width $T_{PW,MOM}$ of the clock signal $CK_{MON}$.

In the above-description, the case where the duty cycle is less than 50% is described. In the case where the duty cycle is greater than 50%, a charging time is longer than a discharging time, and thus full discharging does not occur even after charging and discharging are performed on the capacitor $C_{PWD}$ 122 during one period. As a result, the voltage $V_{PWD}$ is higher than 0 V, whereby the output of the comparator 128 is continuously maintained at high. In this case, the clock signal $CK_{MON}$ is inverted and input, and thus the operation of the duty cycle doubler may be performed in the same manner as the above description.

Figure 13:
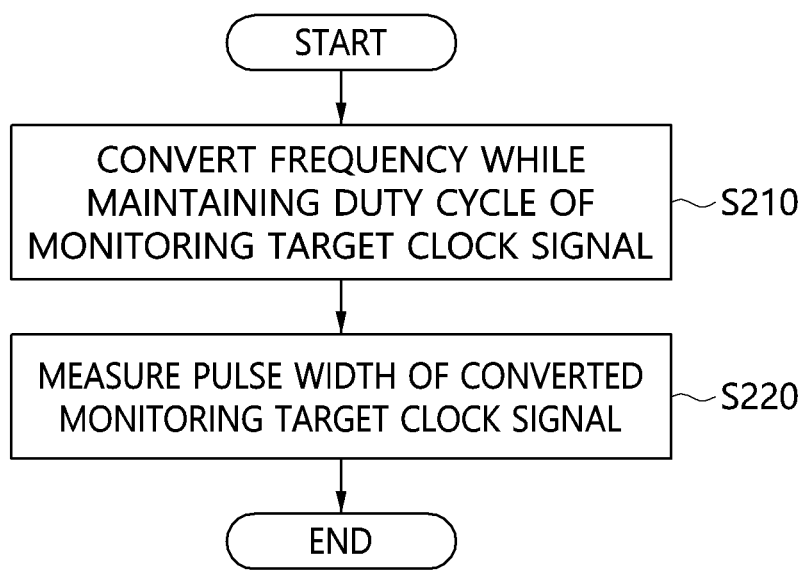
FIG. 13 is a flowchart illustrating a method for monitoring the duty cycle of a memory clock signal according to an embodiment.
Figure 14:
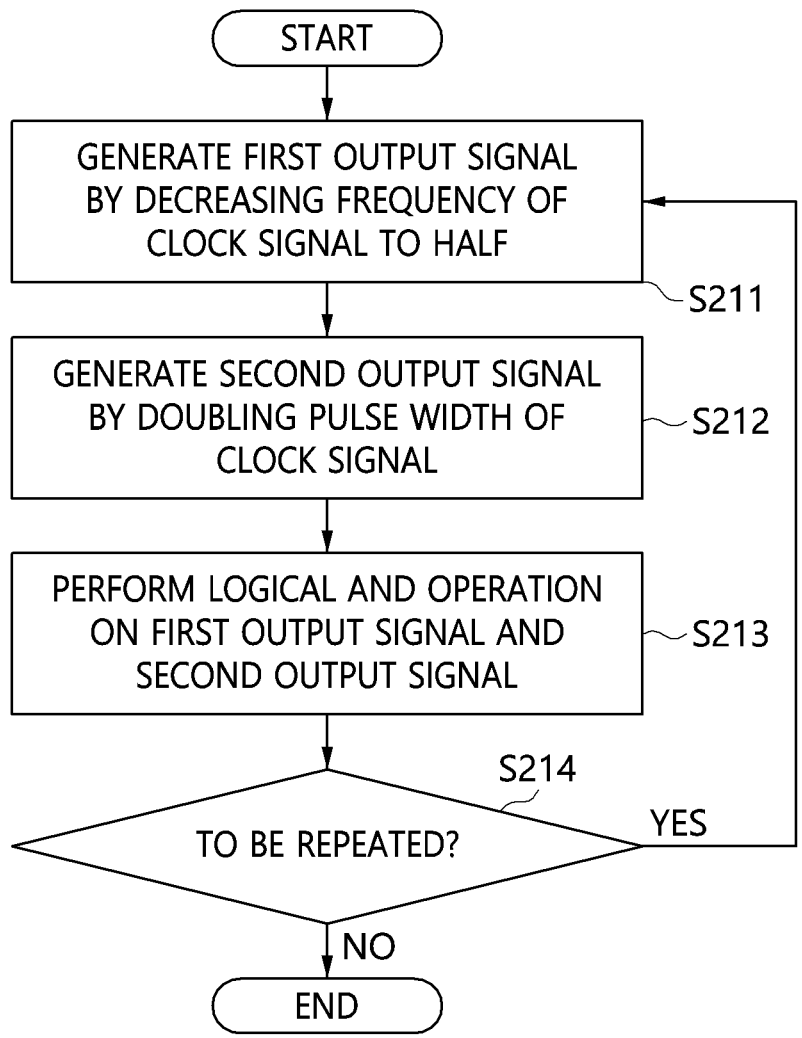
FIG. 14 is a flowchart for explaining the step of generating a second monitoring target clock signal according to an embodiment.

FIG. 13 is a flowchart illustrating a method for monitoring the duty cycle of a memory clock signal according to an embodiment, and FIG. 14 is a flowchart for explaining the step of generating a second monitoring target clock signal according to an embodiment.

Referring to FIG. 13, the method for monitoring the duty cycle of a memory clock signal according to the embodiment may include step S210 of generating a second monitoring target clock signal by decreasing the frequency of a first monitoring target clock signal while maintaining the duty cycle of the first monitoring target clock signal, and step S220 of measuring the pulse width of the second monitoring target clock signal using a reference clock signal.

Here, the first monitoring target clock signal may be used as the reference clock signal.

Referring to FIG. 14, step S210 of generating the second monitoring target clock signal may include step S214 of repeating one or more times steps S211 to S213 of decreasing the frequency of a clock signal to half while maintaining the waveform of the clock signal.

Here, steps S211 to S213 of decreasing the frequency of the clock signal to half while maintaining the waveform of the clock signal may include step S211 of generating a first output signal by decreasing the frequency of the clock signal to half, step S212 of generating a second output signal by doubling the pulse width of the clock signal, and step S213 of performing a logical AND operation on the first output signal and the second output signal.

Figure 15:
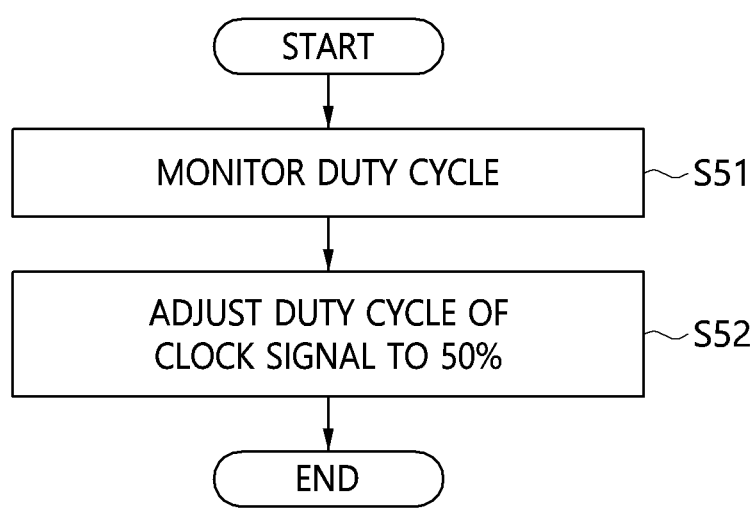
FIG. 15 is a flowchart for explaining a process of monitoring and adjusting a duty cycle according to an embodiment.

FIG. 15 is a flowchart for explaining a process of monitoring and adjusting a duty cycle according to an embodiment.

By utilizing the apparatus and method for monitoring the duty cycle of a memory clock signal according to an embodiment, as illustrated in FIG. 15, a duty cycle is monitored at step S51, after which the duty cycle of the clock signal only needs to be adjusted once so that the duty cycle is 50% based on a measured digitized duty cycle at step S52.

Compared to the embodiment of FIG. 6, the time required for monitoring and adjusting the duty cycle may be greatly reduced according to an embodiment.

Figure 16:
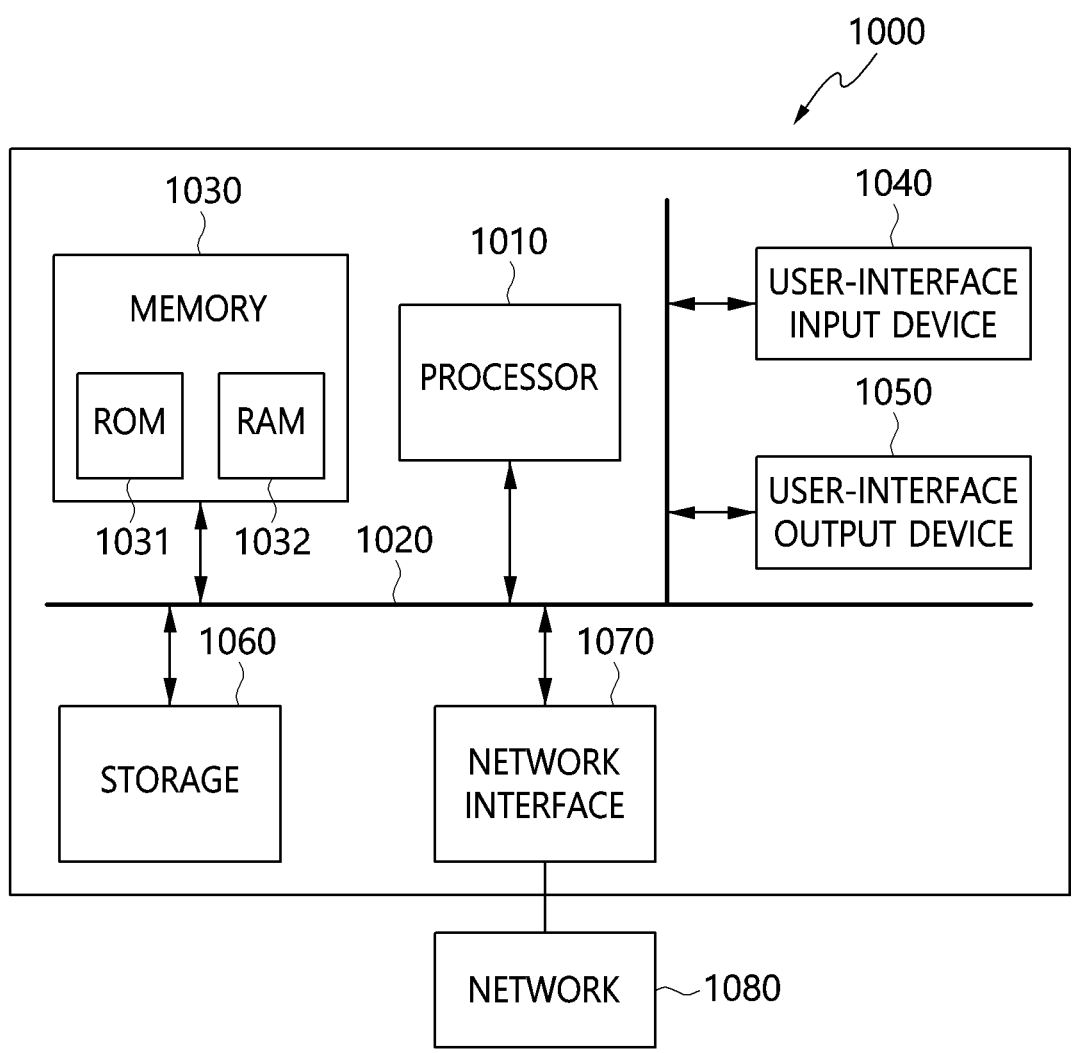
FIG. 16 is a diagram illustrating the configuration of a computer system according to an embodiment.

FIG. 16 is a diagram illustrating the configuration of a computer system according to an embodiment.

The apparatus according to an embodiment may be implemented in a computer system 100 such as a computer-readable storage medium.

The computer system 1000 may include one or more processors 1010, memory 1030, a user interface input device 1040, a user interface output device 1050, and storage 1060, which communicate with each other through a bus 1020. The computer system 1000 may further include a network interface 1070 connected to a network 1080. Each processor 1010 may be a Central Processing Unit (CPU) or a semiconductor device for executing programs or processing instructions stored in the memory 1030 or the storage 1060. Each of the memory 1030 and the storage 1060 may be a storage medium including at least one of a volatile medium, a nonvolatile medium, a removable medium, a non-removable medium, a communication medium, and an information delivery medium. For example, the memory 1030 may include Read-Only Memory (ROM) 1031 or Random Access Memory (RAM) 1032.

When the foregoing embodiments are applied, the time required to repeatedly perform monitoring and adjustment of the duty cycle of a clock signal that becomes a reference for data transmission/reception in a DDR DRAM-based memory interface system may be minimized, thus maximally securing the actual data transmission time.

That is, in the foregoing embodiments, after a digitized duty cycle is accurately measured at one time without repetition of monitoring and adjustment of a duty cycle, the duty cycle is adjusted once based on the measured value, thus minimizing the time required for the repetition of monitoring and adjustment of the duty cycle.

Although the embodiments of the present disclosure have been disclosed with reference to the attached drawing, those skilled in the art will appreciate that the present disclosure can be implemented in other concrete forms, without changing the technical spirit or essential features of the disclosure. Therefore, it should be understood that the foregoing embodiments are merely exemplary, rather than restrictive, in all aspects.

What is claimed is:

1. An apparatus for monitoring a duty cycle of a memory clock signal, comprising:
  a clock frequency converter configured to generate a second monitoring target clock signal by decreasing a frequency of a first monitoring target clock signal while maintaining a duty cycle of the first monitoring target clock signal; and
  a pulse counter configured to measure a pulse width of the second monitoring target clock signal using the first monitoring target clock signal,
  wherein the clock frequency converter comprises a plurality of half clock generators connected in cascade, each of the half clock generators being configured to output a clock signal by decreasing a frequency of an input clock signal to half while maintaining a duty cycle of the input clock signal, wherein each of the half clock generators comprises:

a clock divider configured to decrease the frequency of the input clock signal to half;

a pulse width doubler configured to double a pulse width of the input clock signal; and an AND gate configured to perform a logical AND operation on an output signal of the clock divider and an output signal of the pulse width doubler.

2. The apparatus of claim 1, wherein the pulse width doubler comprises:

a capacitor and a reset switch connected in parallel between a first node and a ground terminal;

a first current source, wherein a positive terminal of the first current source is connected to a power source;

a first switch connected between a negative terminal of the first current source and the first node and turned on/off in response to the first monitoring target clock signal;

a second current source, wherein a negative terminal of the second current source is grounded;

a second switch connected between a positive terminal of the second current source and the first node and turned on/off in response to an inverted signal of the first monitoring target clock signal; and a comparator, wherein a positive terminal of the comparator is connected to the first node and a negative terminal of the comparator is grounded.

3. The apparatus of claim 1, wherein:

the pulse counter includes multiple flip-flops, the second monitoring target clock signal is input as an enable signal of each of the multiple flip-flops, and the first monitoring target clock signal as reference clock signal is input as a clock signal to each of the multiple flip-flops.

4. A method for monitoring a duty cycle of a memory clock signal, comprising:

generating a second monitoring target clock signal by decreasing a frequency of a first monitoring target clock signal while maintaining a duty cycle of the first monitoring target clock signal; and measuring a pulse width of the second monitoring target clock signal using the first monitoring target clock signal, wherein generating the second monitoring target clock signal comprises:

performing a plurality of times an operation of decreasing a frequency of a clock signal to half while maintaining a duty cycle of the clock signal, wherein decreasing the frequency of the clock signal to half while maintaining the duty cycle of the clock signal comprises:

generating a first output signal by decreasing the frequency of the clock signal to half;

generating a second output signal by doubling a pulse width of the clock signal; and performing a logical AND operation on the first output signal and the second output signal.

5. A device for converting a frequency of a duty cycle monitoring target clock signal, wherein:

the device is configured to generate a second monitoring target clock signal by decreasing a frequency of a first monitoring target clock signal while maintaining a duty cycle of the first monitoring target clock signal, and the device comprises a plurality of half clock generators connected in cascade, each of the half clock generators being configured to output a clock signal by decreasing a frequency of an input clock signal to half while maintaining a duty cycle of the input clock signal, wherein each of the half clock generators comprises:

a clock divider configured to decrease the frequency of the input clock signal to half;

a pulse width doubler configured to double a pulse width of the input clock signal; and an AND gate configured to perform a logical AND operation on an output signal of the clock divider and an output signal of the pulse width doubler.

6. The device of claim 5, wherein the pulse width doubler comprises:

a capacitor and a reset switch connected in parallel between a first node and a ground terminal;

a first current source, wherein a positive terminal of the first current source is connected to a power source;

a first switch connected between a negative terminal of the first current source and the first node and turned on/off in response to the first monitoring target clock signal;

a second current source, wherein a negative terminal of the second current source is grounded;

a second switch connected between a positive terminal of the second current source and the first node and turned on/off in response to an inverted signal of the first monitoring target clock signal; and a comparator, wherein a positive terminal of the comparator is connected to the first node and a negative terminal of the comparator is grounded.

* * * * *